United States Patent [19]

Schaper

[11] Patent Number: 5,410,107
[45] Date of Patent: Apr. 25, 1995

[54] MULTICHIP MODULE

[75] Inventor: Leonard W. Schaper, Fayetteville, Ark.

[73] Assignee: The Board of Trustees of the University of Arkansas, Little Rock, Ark.

[21] Appl. No.: 24,616

[22] Filed: Mar. 1, 1993

[51] Int. Cl.⁶ ............................................. H05K 1/03
[52] U.S. Cl. ................................... 174/255; 174/261; 174/262; 361/805; 361/794; 361/795
[58] Field of Search ............... 361/772, 794, 795, 805; 174/250, 255, 260, 261, 262; 439/44, 47, 48

[56] References Cited

U.S. PATENT DOCUMENTS

| | | | |
|---|---|---|---|
| 3,846,166 | 11/1974 | Saiki et al. | 117/212 |
| 4,675,717 | 6/1987 | Herrero et al. | 357/71 |
| 4,811,082 | 3/1989 | Jacobs | 357/80 |
| 4,866,507 | 9/1989 | Jacobs | 357/74 |
| 4,927,983 | 5/1990 | Jones et al. | 174/258 |
| 4,956,749 | 9/1990 | Chang | 361/795 |
| 5,165,166 | 11/1992 | Carey | 29/847 |
| 5,272,600 | 1/1993 | Carey | 174/255 X |

OTHER PUBLICATIONS

H. Hashemi, et al., "Electrical Characterization of a Reduced Metal Layer Copper-Polymide Multi-Chip Module Structure", Microelectronics & Computer Technology Corp. (MCC), Sep., 1992.

*Primary Examiner*—Leo P. Picard
*Assistant Examiner*—L. Thomas
*Attorney, Agent, or Firm*—Hill, Steadman & Simpson

[57] ABSTRACT

An electrical interconnection medium having first and second overlying interconnection layers, each interconnection layer including parallel conductors, the conductors of the first and second interconnection layers being oriented orthogonal to each other, the conductors being interconnected so as to form at least two electrical planes, the conductors of the electrical planes being substantially interdigitated on each interconnection layer, portions of each plane appearing on both layers. The interconnection medium advantageously is employed as a multichip module.

21 Claims, 2 Drawing Sheets

MULTICHIP MODULE

BACKGROUND OF THE INVENTION

The invention generally relates to integrated circuit chips and media for interconnecting same. More particularly, the invention relates to assemblies known as multichip modules (MCM) wherein unpackaged integrated circuit chips can be mounted on and wired to a substrate containing multiple patterned metal levels for power distribution and signal interconnection.

An MCM generally comprises a substrate on which are formed patterned conductive regions for the interconnection of circuit components, usually integrated circuit chips. The conductive regions are usually made of metal and formed in multiple levels, referred to herein as metal or interconnection levels or layers.

It is known that a substrate of an MCM can be fabricated of a variety of materials such as silicon, ceramic (for example, alumina), glass, or metal (for example, aluminum). It is also known that an interconnection level or layer can be formed on the substrate by depositing, sputtering, evaporating, in combination sputtering and plating, or by some other technique a conductive region on a given layer. The conductive region then can be patterned into signal and power distribution conductors by photolithographic techniques combined with etching or selective plating. Multiple interconnection levels or layers can be formed so long as suitable interposing insulating layers are provided.

Interposing levels of insulating dielectric, i.e., insulating layers disposed between interconnection layers, can be applied by spinning, in the case of polymers, or chemical or physical vapor deposition, in the case of organics such as silicon dioxide. Holes (vias) patterned in these insulating layers by photolithography and wet or dry etching techniques allow interconnection from one level of metal to another.

An MCM substrate provides an interconnection medium for a plurality of chips that is more advantageous than, for example, printed circuit boards to which are mounted individually packaged chips, because it dramatically reduces the distance required for signals to travel between chips, and thus the time delay for interchip signal propagation. As integrated circuit technology has continued to advance higher circuit speeds, this interconnection delay has become a major limitation on system performance, and thus has increased the importance of MCMs as interconnection media.

Also, for electronic systems, the use of an MCM and unpackaged chips advantageously results in far greater packing density of chips, and thus reduced system size.

A disadvantage of present MCM systems of packaging and interconnection systems has been the high cost of MCM fabrication. The fabrication process is similar to that for integrated circuits (IC), and manufacturing equipment designed for integrated circuits generally has been used to fabricate MCMs, although an older generation of equipment generally can be used since MCM feature sizes are considerably larger than IC feature sizes. The manufacturing process of MCMs is essentially sequential, and the cost is roughly proportional to the number of photolithographic masks used in fabrication.

In this regard, it is common practice for MCM manufacturers to use at least four metal or interconnection levels, and thus eight or more masks, to provide for both power distribution and signal interconnections. Typically, there is one level each for a power plane, a ground plane, signals in the X direction, and signals in the Y direction. A mask is used for each level to pattern the conductive regions or conductors, and then another mask is used at each level to pattern the holes (vias) in the intervening dielectric to the next interconnection level.

The uppermost layer of an MCM usually is a dielectric which protects the entire structure, and whose pattern of openings to underlying conductive regions allows connections to be made between chips or the MCM package and the substrate itself by means of wire bonds, solder bumps, or other interconnection means.

In some substrate manufacturing technologies, additional masks are required for top level metallization compatible with wire bond or solder interconnect processes. It is also common to include some form of capacitor dielectric for decoupling purposes between the large area power and ground planes, and this dielectric must be patterned with yet another mask. All of these mask levels contribute to fabrication complexity and cost, and each manufacturing step in some incremental manner contributes to the inevitable yield loss due to manufacturing defects.

The combined maximum wiring density in a set of MCM signal planes generally can exceed 2,000 inches of wire per square inch of substrate. Yet, except in areas of the highest wiring congestion, most MCM designs use only a fraction of the available wiring capacity on the signal planes.

It is known that a pair of solid power distribution planes, one plane for power and one plane for ground, form an extremely low inductance power distribution system for relatively noise-free power delivery to semiconductor chips. It is also known that sandwiching a thin layer of dielectric material between these planes creates a distributed decoupling capacitor with very good high frequency characteristics. For example, see U.S. Pat. No. 4,675,717, the disclosure of which is incorporated herein by reference. Further, advances in discrete capacitor technology have resulted in decoupling capacitors with extremely low internal inductance. The use of these capacitors with a pair of power distribution planes also can result in a relatively noise-free power distribution environment. For example, see Tummala, et al. "Ceramics Packaging with Ferroelectric Decoupling Capacitor", *IEEE International Symposium on Applications of Ferroelelctrics,* 1990, pp. 28–30, the disclosure of which is fully incorporated herein by reference.

It is also known that a solid power distribution plane can be perforated with an array of holes with little change in the electrical characteristics thereof. Such planes are commonly used in MCMs on layers which overlay polymer dielectrics, to allow outgassing of the polymer during curing. The resulting structure is known as a mesh plane.

Further, both power and ground potentials can be distributed on one physical layer by means of a technique referred to as interdigitation. In interdigitation, long, thin conductive regions are provided on one layer for carrying power and ground potentials or signals. The power and ground regions are alternatively arranged so that every other region carries power potentials or signals while the interposing regions carry a ground potential. In this technique, however, if the conductors are long and thin, parasitic inductance and resistance detrimental to noise-power-free distribution are introduced. See H. Schettler, "Passive-Silicon-Carrier Design and Characteristics", 40th *Electronic Components and Technology Conference*, Las Vegas, May 20–23, 1990, pp. 559–561.

SUMMARY OF THE INVENTION

The present invention provides an interconnection medium wherein the number of interconnect layers is reduced while the low inductance power distribution characteristics of parallel power and ground planes, as well as the high wiring density for signal interconnect wires characteristic of photolithographic fabrication techniques are retained.

To that end, the present invention inventively combines aspects of mesh planes and interdigitation to create what is referred to herein as dual offset mesh planes. The word "dual" denotes the provision of both power and ground planes. The word "offset" denotes the appearance of conductive regions of one electrical plane on two different interconnect layers.

In an embodiment, the invention provides an electrical interconnection medium, comprising at least first and second interconnection layers, each of the interconnection layers comprising a plurality of parallel conductive regions, the conductive regions of the second interconnection layer being oriented orthogonally to the conductive regions of the first interconnection layer, the conductive regions of the first and second interconnection layers being electrically interconnected such that at least two electrical planes are provided and the conductive regions of the electrical planes are substantially interdigitated on each interconnection layer and portions of each electrical plane appear on both interconnection layers, and such that selective conductive regions can be electrically isolated from the two electrical planes to form at least one signal path.

In an embodiment, the invention provides a multichip module comprising a substrate; a first interconnection layer formed on the substrate, the first interconnecting layer comprising a plurality of parallel conductive regions; an insulating layer formed on the first interconnecting layer; and a second interconnecting layer formed on the insulating layer, the second interconnecting layer comprising a plurality of parallel conductive regions that are oriented orthogonally to the conductive regions of the first interconnecting layer; the conductive regions of the first and second interconnecting layers being interconnected such that at least two distinct electrical planes are provided and the conductive regions of the at least two electrical planes are substantially interdigitated in each interconnecting layer, and portions of each electrical plane appear on both interconnecting layers, and such that selected conductive regions can be electrically isolated from the at least two electrical planes.

In an embodiment, the invention provides a multichip module comprising a substrate, having an insulating top surface, first and second interconnecting layers carried on the substrate, each interconnecting layer comprising a plurality of parallel conductive regions, the conductive regions of the second interconnecting layer being oriented orthogonally to the conductive regions of the first interconnecting layer, the conductive regions of the first and second interconnecting layers being interconnected such that at least two electrical planes are provided, the conductive regions of the electrical planes being substantially interdigitated on each of the interconnecting layers and such that portions of each electrical plane appear on each interconnecting layer, pads for connecting power, ground and signal conductors to electrical components, and a plurality of electrical components mounted on the pads.

As explained below, in a single offset mesh plane, all X direction conductors are carried on a first metal layer, and all Y direction conductors are carried on a second metal layer. At each point where these conductive regions overlie one another, they can be interconnected by means of a conducting hole or via through the dielectric separating the two metal layers. These conductive regions thus can comprise one electrical plane. Another plane can be incorporated into the structure by interdigitating in both metal levels a conductive region of opposite polarity between every conductor region of the first plane, and similarly connecting the overlying regions with vias to provide two offset mesh planes. Thus, the two metal levels can contain the electrical equivalent of two mesh planes, with the critically important topological feature that all conductive regions (i.e., conductors) lying in a given metal layer run in the same direction.

These features allow signal conductors to be effectively woven into a fabric of power and ground conductors. During the design process, when a signal path must be included between two points, the designer can determine the necessary X and Y conductors which must be included in the signal path and then isolate portions of the power and/or ground conductors on the metal layers necessary to provide a signal path. Of course, this process can be automated with the use of a computer aided design (CAD) system.

To prevent the deletion of too many power distribution conductors in a given region such that the power distribution capability of the dual offset mesh planes would be impaired, design rules can be implemented. Then, because signal wiring in an MCM tends to be relatively sparse, the functions of power distribution and signal interconnection can effectively be carried in only two metal layers.

These and other features of the present invention are set forth in greater detail in the following detailed description of the presently preferred embodiments and accompanying drawings.

DETAILED DESCRIPTION OF THE PRESENTLY PREFERRED EMBODIMENTS

As described above, the present invention provides a structure or medium for interconnecting semiconductor chips requiring only two metal levels. A description of the development of such a structure is described below.

Figure 1:
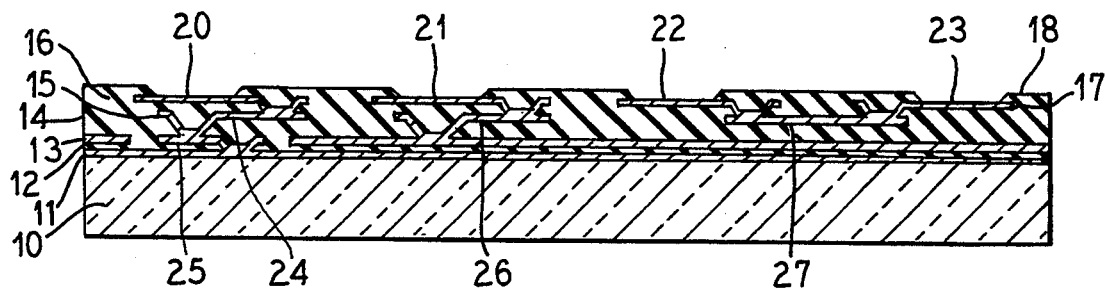
FIG. 1 illustrates a section of a conventional four-layer multichip module substrate.

In FIG. 1 there is illustrated a section of a conventional MCM interconnection medium having four metal layers. As illustrated, formed on a substrate 10 are a ground plane layer 11, a power plane distribution layer 13 and two signal layers 15 and 17, separated by various insulating layers 12, 14 and 16.

In this regard, as illustrated, the substrate 10, can, for example, be made of silicon approximately 500 $\mu m$ thick. The four metal layers 11, 13, 15 and 17 are formed on the substrate. A layer of silicon dioxide approximately 1 $\mu m$ thick, not illustrated, is applied to the surface of the substrate 10 to insulate the first metal layer 11 from the semiconducting silicon layer 10. The layer 11 typically is a continuous ground plane made of sputtered aluminum approximately 2 $\mu m$ thick deposited thereon.

Separating the ground plane 11 and the power distribution plane 13 is a thin layer of silicon dioxide 12, perhaps 1 $\mu m$ thick. This layer of silicon dioxide can be applied by chemical vapor deposition and acts as an insulator and capacitor dielectric between the power plane 13 and the ground plane 11. Photolithographic techniques are used to pattern holes or vias wherever connections to the ground plane are to be made. These vias typically have a diameter on the order of 50 $\mu m$ and have sloping sidewalls so that subsequent metal deposition achieves good sidewall coverage and reliable connection to the ground plane 11.

The power distribution layer 13 is applied in the same manner as the layer 11, and is likewise made of 2 $\mu m$ thick aluminum. Isolated areas 25 of this power plane layer 11, which are used to make connections to the ground plane, are patterned by photolithography and wet chemical etching.

The dielectric layer 14 can consist of a 5 $\mu m$. thick layer of silicon dioxide. Vias in this layer are used to allow connections to both the power layer 13 and the ground layer 11.

The metal signal layer 15 is applied over the dielectric layer 14. Signal conductors 27 in the X direction are patterned in this layer, as are ground connection regions 24 and power connection regions 26.

The dielectric layer 16 separates the two signal layers 15 and 17 and is patterned with many vias for making interconnections between the X and Y signal conductor segments as well as connections to the power layer 13 and ground layer 11. Signal vias provided in this layer 16 typically are smaller than the power vias and are approximately 10 to 20 $\mu m$ in diameter.

The metal signal layer 17 is patterned to form Y direction signal conductors as well as all of the metal pads used to make connections to the chips connected thereto, for example by means of wire bonding. A typical ground pad 20 is illustrated, as well as a power pad 21 and two interconnected signal pads 22 and 23. The MCM is completed with the application and patterning of a dielectric layer 18 which protects the underlying layers from corrosion or mechanical damage. The layer 18 can be approximately 10 $\mu m$ thick.

The foregoing description of a conventional MCM demonstrates the complexity and cost in fabrication required by the conventional four metal layer structure.

Figure 2:
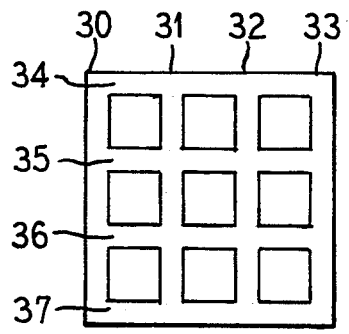
FIG. 2 illustrates X and Y conductive members of a conventional mesh plane.

In FIG. 2 there is illustrated a standard form of a mesh plane 30, which is electrically functionally equivalent to a solid plane, except for an increase in sheet resistance proportional to the percentage of metal which is not present because of the design of the mesh. Mesh planes of this nature generally are used on upper levels of an MCM where an intervening dielectric layer is a polymer which outgases when cured. Horizontal (X) conducting members 34, 35, 36 and 37 connect to vertical (Y) conducting members 30, 31, 32 and 33.

The structure illustrated in FIG. 2 cannot be used to build a two level MCM,

The structure illustrated in FIG. 2 cannot be used to build a two level MCM, however, because any isolated signal conductor introduced onto the mesh would significantly reduce if not sever the connections between conducting members.

Figure 3:
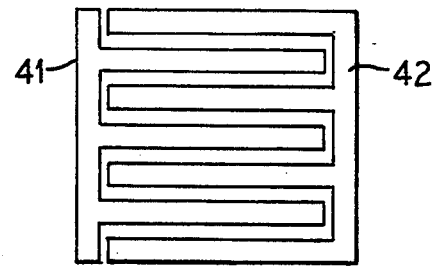
FIG. 3 illustrates an interdigitated power and ground structure on one metal layer.

In FIG. 3 there is illustrated the well-known single layer interdigitated power and ground distribution structure. The ground path in this structure is provided by conducting regions or conductors 41, 44, 46 and 48 and the power path is provided by conducting regions 42, 43, 45, 47 and 49. These various conductors allow power distribution to anywhere on the module and connections to chips by way of pads included on the power and ground conductors. As described in the Schettler article identified previously, this structure has been used to build MCMs, but the electrical distribution characteristics are undesirable for general use because of the high parasitic resistance and inductance in the long, thin conductors.

Figure 4:
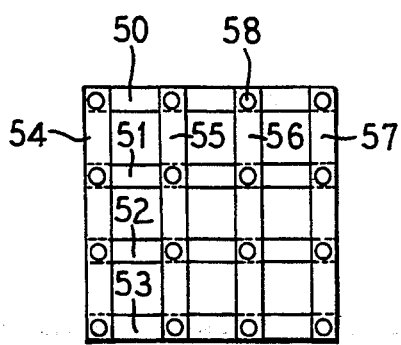
FIG. 4 illustrates an offset mesh plane embodying principles of the invention.

In FIG. 4 there is illustrated an offset mesh plane 50A, or at least a portion thereof. Conductive regions 50, 51, 52 and 53 typically can be of 2 $\mu m$ thick and 15 $\mu m$ wide and spaced on 50 $\mu m$ centers. All of these dimensions are typical of those that might be advantageous on a thin film MCM. The invention has general applicability for many interconnection media and thus these dimensions are for illustrative purposes only. These conductive regions 50, 51, 52 and 53 lie on a first physical metal layer.

Conductive regions 54, 55, 56 and 57 are of similar dimensions, but are formed on a second physical metal layer. Everywhere the conductors overlie each other, they are joined together by means of a via, such as via 58, which typically would be 10 $\mu m$ in diameter through a 5 $\mu m$ thick dielectric layer separating the first and second metal layers. As these vias have a low aspect ratio, they introduce very little parasitic inductance and resistance into the mesh, which otherwise is electrically equivalent to the mesh plane of FIG. 2.

The important topological difference between the mesh planes of FIG. 2 and FIG. 4 is that the long sections of conductors on either layer of the mesh plane of FIG. 4 can be removed without destroying the overall electrical characteristics of the mesh, so long as not too many wires are removed. For example, if the conductors 51, 53, 55 and 57 were removed, the result would still be an offset mesh plane, but with a line pitch of 100 $\mu m$ instead of 50 $\mu m$. The parasitic resistance and inductance of the structure would be doubled, but the essentials of a planar distribution structure would be preserved.

It is the foregoing feature which allows the selective removal, within a computer aided design (CAD) system, at the design stage, of sections of the power distribution conductors (i.e., conductors of the power and ground planes) to provide room to include relatively sparse signal conductors. As long as mesh pitch remains electrically less in propagation time than 1/10th the signal rise time, no transmission line effects need to be taken into account; the mesh essentially will appear electrically as a solid plane. Alternatively, if a high performance power distribution system is not required, the conductors could lie at an even greater pitch, and no conductor segments would have to be removed to make room for signal paths.

Figure 5:
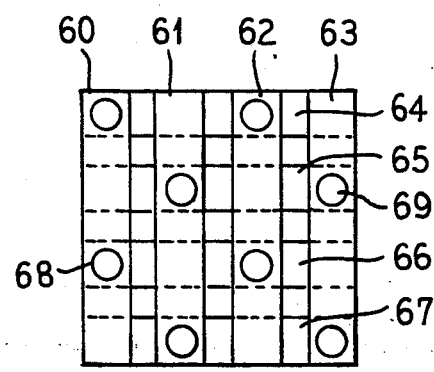
FIG. 5 illustrates the combination of two of the planes illustrated in FIG. 4 to produce a dual offset mesh plane.

In FIG. 5 there is illustrated a dual offset mesh planes structure embodying features of the invention. In the illustrated construction, distribution of both power and ground potentials by means of interdigitating respective conductors of two offset mesh planes, is allowed. A 100 μm pitch of the conductors of the offset mesh plane of FIG. 4 allows space for these interdigitated conductors.

In the illustrated structure of FIG. 5, conductors 64 and 66 reside on a first metal layer and carry ground, while conductors 65 and 67 carry power. Similarly, conductors 60 and 62 reside on a second metal layer and carry ground, while conductors 61 and 63 carry power. Vias such as 68 join ground conductors at every intersection, while vias such as via 69 join power conductors.

It can be appreciated that in FIG. 5 only a very small dual offset mesh plane or section thereof is illustrated. It can be further appreciated that the structure illustrated in FIG. 5 can be expanded to be very large and that the illustrated pattern would continue over the entire extent of the power distribution system. As in the case of the single offset mesh plane of FIG. 4, isolated signal conducting regions can be introduced in the first and second metal layers during the design process, where required.

It can be appreciated that the power distribution system described in connection with FIG. 5 contains no provision for distributed decoupling capacitor, as described in applicant's earlier U.S. Pat. No. 4,675,717. Instead, the necessary decoupling capacitance in the present system could be provided by discrete decoupling capacitors soldered or attached with conductive epoxy to interconnecting pads formed on the substrate. Recent advances in low inductance capacitor fabrication, such as described in the Tummala article identified above, allow this to be done in a manner which preserves a low power distribution impedance up to high frequencies.

Figure 6:
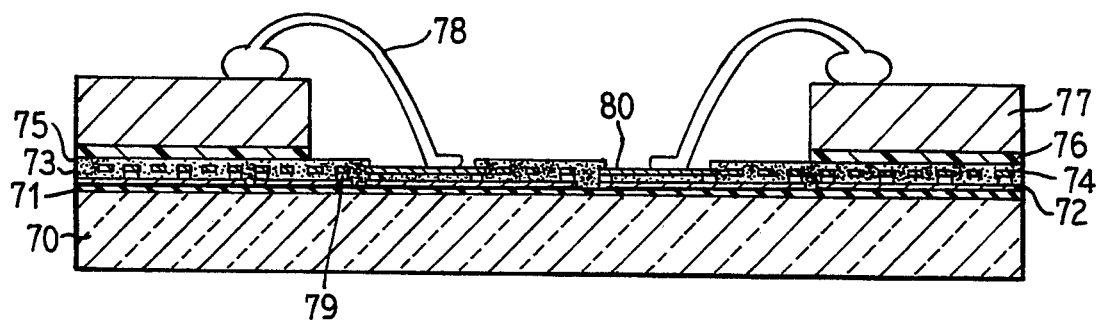
FIG. 6 illustrates a section of a multichip module substrate fabricated in only two metal levels.

In FIG. 6 there is illustrated a cross sectional view of an MCM structure embodying principles of the invention. In FIG. 6, base substrate 70 carries an unpatterned insulating layer 71 thereover. It can be appreciated that the unpatterned insulating layer 71 can be omitted if the substrate 71 itself is made of an insulating material.

Formed over the insulating layer 71 is a first metal layer 72. The first metal layer 72 is patterned using the same fabrication techniques as are used in forming a conventional MCM substrate. In the view illustrated in FIG. 6, conducting regions parallel to the plane of the figure are carried in the layer 72.

A dielectric insulating layer 73 is deposited over the first metal layer 72 and is employed to separate the layer 72 from a second metal layer 74. The dielectric insulating layer 73 is perforated with vias such as the via 79 for the reasons set forth above.

The second metal layer 74, also patterned, carries conductors perpendicular to the plane of FIG. 6 and also includes pads such as the pad 80, used to interconnect chips, passive components, and an MCM package or other exterior connections.

Deposited over the layer 74 is another dielectric layer. The layer 75 is patterned to expose the connection pads, but otherwise protects the substrate from corrosion and mechanical damage. Layer 75 could be omitted under certain circumstances.

The illustrated regions 76 are die attachment materials such as epoxy used to mount semiconductor dies or other components to the substrate. Regions 77 are the dies themselves. Wire bonds 78 serve to connect the bonding pads on the dies 77 to corresponding ones in the substrate.

Figure 7:
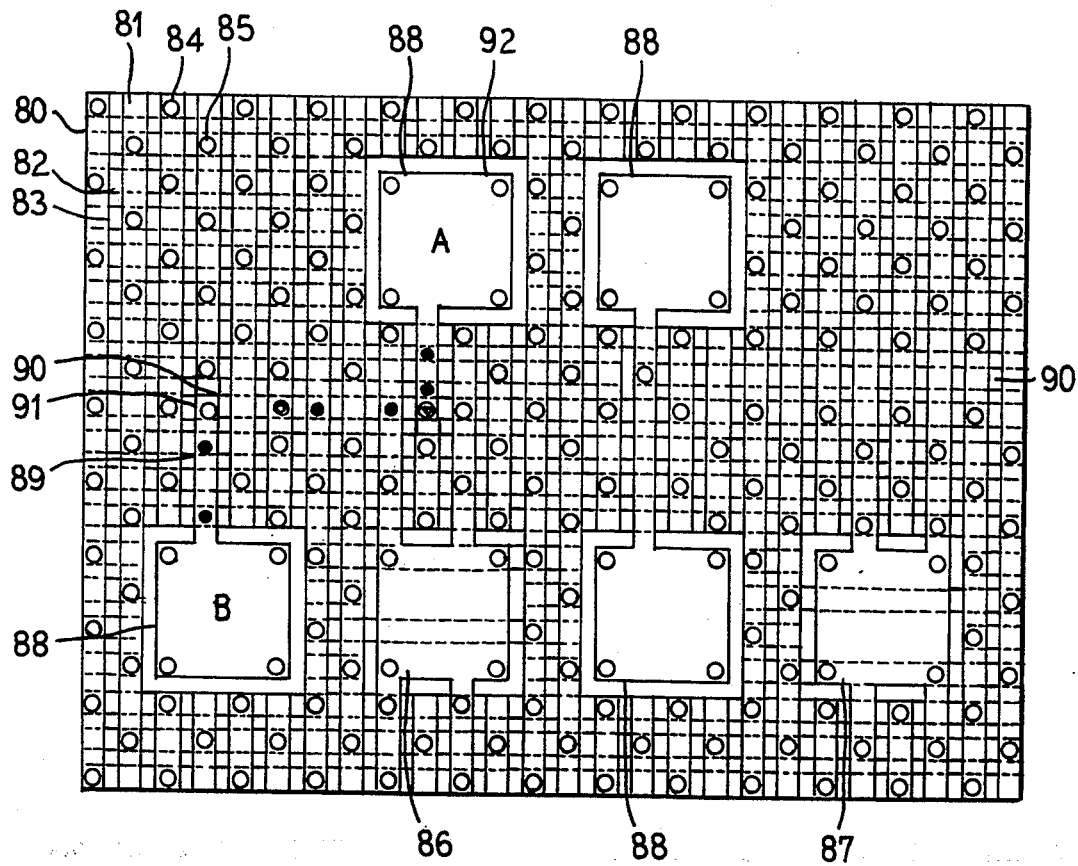
FIG. 7 illustrates a top view of a multichip module substrate showing power, grounds, and signal pads used for interconnecting semiconductor chips, as well as several signal traces woven into a power distribution mesh.

In FIG. 7 there is illustrated in plan view a dual offset mesh plane MCM. It can be appreciated that in the view illustrated in FIG. 7, is revealed how conductive regions for signal interconnection and pads for interconnecting the MCM substrate to chips and to the MCM package are provided.

As illustrated, the ground mesh is provided by means of X conductors such as conductor 82 in the first metal layer, Y conductors such as the conductor 80 in the second metal layer, and vias such as the via 84 at every intersection of the ground conductors. Similarly, the power mesh is provided by means of X conductors such as the conductor 83 in the first metal layer, Y conductors such as the conductor 81 in the second metal layer, and vias such as the via 85 at every intersection of the power conductors.

It can be appreciated that the above structure can provide an electrical interconnection medium, comprising at least first and second interconnection layers, each of the interconnection layers comprising a plurality of parallel conductive regions, the conductive regions of the second interconnection layer being oriented orthogonally to the conductive regions of the first interconnection layer, the conductive regions of the first and second interconnection layers being electrically interconnected such that at least two electrical planes are provided and the conductive regions of the electrical planes are substantially interdigitated on each interconnection layer and portions of each electrical plane appear on both interconnection layers, and such that selective conductive regions can be electrically isolated from the two electrical planes to form at least one signal path.

The above structure also can provide a multichip module comprising a substrate; a first interconnection layer formed on the substrate, the first interconnecting layer comprising a plurality of parallel conductive regions; an insulating layer formed on the first interconnecting layer; and a second interconnecting layer formed on the insulating layer, the second interconnecting layer comprising a plurality of parallel conductive regions that are oriented orthogonally to the conductive regions of the first interconnecting layer; the conductive regions of the first and second interconnecting layers being interconnected such that at least two distinct electrical planes are provided and the conductive regions of the at least two electrical planes are substantially interdigitated in each interconnecting layer, and portions of each electrical plane appear on both interconnecting layers, and such that selected conductive regions can be electrically isolated from the at least two electrical planes.

Further, the structure can provide a multichip module comprising a substrate, having an insulating top surface, first and second interconnecting layers carried on the substrate, each interconnecting layer comprising a plurality of parallel conductive regions, the conductive regions of the second interconnecting layer being oriented orthogonally to the conductive regions of the first interconnecting layer, the conductive regions of the first and second interconnecting layers being interconnected such that at least two electrical planes are provided, the conductive regions of the electrical planes being substantially interdigitated on each of the interconnecting layers and such that portions of each electrical plane appear on each interconnecting layer, pads for connecting power, ground and signal conductors to electrical components, and a plurality of electrical components mounted on the pads.

As further illustrated in FIG. 7, pads are inserted into the dual offset mesh planes (i.e., formed thereon) as required for chip or external connections. To facilitate wire bonding, all pads can be 90 µm square on both metal layers, with four vias 92 in the corners thereof. A 10 µm guard band can separate the pad from the power distribution mesh.

Isolated signal pads 88 require a continuous guard band. To create a ground pad 86, all ground conductors which intersect the pad are allowed to remain. The power pad 87 similarly comprises only the power conductors such as conductors 81 and 83 which would intersect the pad.

X direction signal conductors 90 in the first metal level and Y direction signal conductors 89 in the second metal level are inserted by means of a design system just as a normal router would insert wires into available wiring tracks. Each signal conductor segment so inserted must be surrounded by a guard band to insulate it from the power distribution mesh and must begin and end either in a via 91 to an orthogonal segment in the other metal level or at an isolated signal pad 88. All other vias which would short the signal line to portions of the power distribution system on the other metal plane would be removed by the CAD system.

Wiring rules similar to those used by conventional CAD systems to assign wires to wiring tracks can be used to limit the density of power mesh conductors removed during the signal conductor track assignment process.

Because of the fine pitch of the wires provided by the design rules, in this example, it is possible for the available signal wiring to be substantial. If every third power distribution wire were removed, leaving power and ground pairs of wires between each pair of signal wires, and if the basic wiring pitch were 25 µm, the available signal wiring density would still be 667 inches of wire per square inch of substrate. Removing only a third of the power distribution mesh is extremely conservative, so that signal wiring densities of 1,000 wires per square inch should easily be achieved with manufacturing processes in place today.

It should also be noted that signal conductors formed according to the principles described above will exist in a constant impedance environment, since all mesh conductors will be at alternating current ground and the holes in the mesh will be invisible to signals at practical frequencies of interest. The expected characteristic impedance of these lines will be higher than those in a stripline or a microstrip environment for the same dielectric dimensions, which is desirable so that dielectric layers can be thin. Crosstalk should be extremely low because of the shielding characteristics of the intervening power mesh conductors between signal lines.

Although emphasis herein has been placed on the application of the invention to thin film multichip modules, the principles of the invention are also applicable to other interconnection media such as printed wiring boards, ceramic multichip modules, fine line laminate-based multichip modules and even to semiconductor chips themselves. It is intended that the claims set forth hereinafter are to encompass such other modifications.

Further, although a construction in which all conductors are formed on one side of a substrate has been described, the principles of the invention are equally applicable if the two conducting layers were formed on opposite sides of a substrate, wafer, dielectric film, or other insulating medium, through which the interconnecting vias are constructed.

It can be appreciated from the foregoing discussion that there can be provided a method of forming a multichip module comprising steps of:

providing a substrate;

forming a first interconnecting layer on said substrate, said first interconnecting layer comprising a plurality of parallel conductive regions;

covering the first interconnecting layer with an insulating layer;

forming a pattern of conductive vias in said insulating layer; and forming a second interconnect layer over said insulating layer, the second interconnect layer comprising a plurality of conductive regions overlying and oriented orthogonal to the conductive regions of the first interconnect layer, the conductive regions in the conductive regions of the first and second interconnecting layers being electrically interconnected such that at least two electrical planes are formed, the conductive regions of the electrical planes being substantially interdigitated on each interconnecting layer, portions of each electrical plane appearing on both interconnecting layers.

It is to be understood that while the above description concerns preferred embodiments of the present invention, numerous modifications and alternatives may be devised by those skilled in the art without departing from the spirit and scope of the invention.

What is claimed is:

1. An electrical interconnection medium, comprising:
an insulating layer;
a pattern of conductive vias in the insulating layer;
at least first and second overlying interconnection layers, each of the interconnection layers comprising:
a plurality of interdigitated first and second parallel conductive regions, the conductive regions of said second interconnection layer being oriented orthogonally to the conductive regions of the first interconnection layer, the conductive regions of the first and second interconnection layers being electrically interconnected such that at least two distinct electrical planes are provided, the first conductive regions of the first and second interconnection layers forming a power plane, the second conductive regions of the firs and second interconnection layers forming a ground plane, portions of each electrical plane appearing on both interconnection layers;

an isolated signal path in at least one interconnection layer, said signal path comprising selected isolated and interconnected portions of the first and second conductive regions which otherwise form said power and ground planes;

the first conductive regions of the first and second interconnection layers being electrically interconnected by the conductive vias in the insulating layer at every point at which the first conductive regions overlie one another except along said signal path, the second conductive regions of the first and second interconnection layers being electrically interconnected by the conductive vias in the insulating layer at every point at which the second conductive regions overlie one another except along said signal path;

pads in at least one of the interconnection layers for making electrical connections to each electrical plane; and at least one pad in the at least one interconnection layer for making electrical connection to the signal path.

2. The electrical interconnection medium of claim 1, wherein each pad comprises an area where overlying conductive regions of one electrical plane are interconnected, and interdigitated conductive regions of any other electrical plane are omitted.

3. The electrical interconnection medium of claim 1, further comprising a substrate on which the first layer is formed.

4. The electrical interconnection medium of claim 3, wherein the substrate comprises an insulating surface on which said first interconnection layer is formed.

5. The electrical interconnection medium of claim 3, wherein the substrate comprises silicon.

6. The interconnection medium of claim 1, wherein the medium is a multichip module.

7. The electrical interconnection medium of claim 1, wherein the insulating layer is a dielectric layer on opposite surfaces of which are positioned the first and second interconnection layers.

8. The electrical interconnection medium of claim 1, comprising a plurality of signal paths.

9. A multichip module comprising:

an insulating layer with two surfaces;

a pattern of conductive vias in the insulating layer;

a first interconnecting layer formed on one surface of the insulating layer, the first interconnecting layer comprising a plurality of parallel isolated signal conductive regions and interdigitated first and second conductive regions, the isolated signal conductive regions comprising selected isolated portions of the first and second conductive regions;

a second interconnecting layer formed on the other surface of the insulating layer so as to substantially overlie the first interconnecting layer, the second interconnecting layer comprising a further plurality of parallel isolated signal conductive regions and interdigitated first and second conductive regions that are oriented orthogonally to the conductive regions of the first interconnecting layer, said isolated conductive regions in said second interconnecting layer comprising selected isolated portions of the first and second conductive regions in the second interconnecting layer, the conductive regions of said first and second interconnecting layers being interconnected to form at least two distinct electrical planes with portions of each electrical plane appearing on both interconnecting layers, the first conductive regions of the first and second interconnecting layers being electrically interconnected by means of the conductive vias in the insulating layer at every point at which the first conductive regions overlie one another except along said isolated signal conductive regions in the first and second interconnecting layers, the second conductive regions of the first and second interconnecting layers being electrically interconnected by means of the conductive vias in the insulating layer at every point at which the second conductive regions overlie one another except along said isolated conductive regions in said first and second interconnecting layers, the first conductive regions of the first and second interconnecting layers forming a power plane, the second conductive regions of the first and second interconnecting layers forming a ground plane, the isolated signal conductive regions in the first and second interconnecting layers being electrically interconnected by the conductive vias in the insulating layer at every point at which the isolated signal conductive regions overlie one another thereby forming at least one signal path;

pads in at least one of the interconnecting layers for making connections to each electrical plane; and pads in at least one interconnecting layer for making connections to the at least one signal path.

10. The multichip module of claim 9, wherein the insulating layer is a dielectric layer.

11. The multichip module of claim 9, wherein each pad comprises an area on said at least one interconnecting layer at which conductive regions of a given electrical plane are interconnected and conductive regions of another electrical plane are omitted.

12. The multichip module of claim 9 comprising a plurality of signal paths.

13. A multichip module comprising:

a substrate having an insulating top surface;

first and second overlying interconnecting layers carried on the substrate and separated by an insulating layer, each interconnecting layer comprising parallel isolated signal conductive regions and interdigitated first and second conductive regions, the isolated signal conductive regions comprising selected isolated portions of the first and second conductive regions, the conductive regions of the second interconnecting layer being oriented orthogonally to the conductive regions of the first interconnecting layer, the first and second conductive regions of the first and second interconnecting layers being interconnected to form at least two electrical planes, the first conductive regions of the first and second interconnecting layers being electrically interconnected by conductive vias in the insulating layer at every point at which the first conductive regions overlie one another except along said isolated signal conductive regions, the second conductive regions of the first and second interconnecting layers being electrically interconnected by conductive vias in the insulating layer at every point at which the first conductive regions overlie one another except along said isolated signal conductive regions, the first conductive regions of the first and second interconnecting layers forming a power plane, the second conductive regions of the first and second interconnecting layers forming a ground plane, the isolated signal conductive regions of the first and second interconnecting layers being interconnected by conductive vias in the insulating layer to form at least one signal path;

pads for connecting the power, ground and isolated signal conductive regions to electrical components; and a plurality of electrical components connected to said pads.

14. The multichip module of claim 13, comprising an additional dielectric insulating layer above the second interconnecting layer, the additional insulating layer comprising openings through which electrical connections can be made to said pads.

15. The multichip module of claim 13, wherein the substrate comprises silicon.

16. The multichip module of claim 13, wherein the substrate is fabricated with a material selected from the group consisting of silicon, ceramic, glass and aluminum.

17. The multichip module of claim 14, wherein the insulating layer comprises a polymer.

18. The multichip module of claim 13 comprising a plurality of signal paths.

19. A method of forming a multichip module comprising the steps of:
   providing a dielectric layer;
   forming a first interconnecting layer on one surface of said dielectric layer comprising a plurality of parallel interdigitated first and second conductive regions;
   isolating a portion of said interdigitated first and second conductive regions in said first interconnecting layer to form a plurality of parallel isolated signal conductive regions in said first interconnecting layer;
   forming a second interconnecting layer over said dielectric layer comprising a plurality of parallel interdigitated first and second conductive regions overlying and oriented orthogonally to the conductive regions of the first interconnecting layer;
   isolating a portion of said interdigitated first and said conductive regions in said second interconnecting layer to form a plurality of parallel isolated signal conductive regions in said second interconnecting layer;
   forming a pattern of conductive vias in said dielectric layer for electrically interconnecting the conductive regions in the first and second interconnecting layers to form at least two electrical planes, for electrically interconnecting the first conductive regions of the first and second interconnecting layers at every point at which the first conductive regions overlie one another except along said isolated signal conductive regions, for electrically interconnecting the second conductive regions of the first and second interconnecting layers at every point at which the first conductive regions overlie one another except along said isolated signal conductive regions, the first conductive regions of the first and second interconnection layer forming a power plane as one of said electrical planes, the second conductive regions of the first and second interconnection layers forming a ground plane as another of said electrical planes, the first and second conductive regions of the electrical planes being substantially interdigitated on each interconnecting layer such that portions of each electrical plane appear on both interconnecting layers, and for electrically interconnecting, the isolated signal conductive regions of the first and second interconnecting layers at every point at which the isolated signal conductive regions overlie one another to form at least one signal path.

20. An electrical interconnection medium, comprising:
   a thin dielectric layer;
   a pattern of conductive vias in the dielectric layer;
   first and second overlying interconnection layers on opposite sides of the dielectric layer, each of the interconnection layers comprising:
      a plurality of parallel interdigitated first and second parallel conductive regions, the conductive regions of said second interconnection layer being oriented orthogonally to the conductive regions of the first interconnection layer, the conductive regions of the first and second interconnection layers being electrically interconnected such that at least two distinct electrical planes are provided, the first conductive regions of the first and second interconnection layers forming a power plane, the second conductive regions of the first and second interconnection layers forming a ground plane, portions of each electrical plane appearing on both interconnection layers;
   isolated signal conductive regions on the first and second interconnecting layers, the isolated signal conductive regions being electrically interconnected by the conductive vias in the insulating layer at every point at which the isolated signal conductive regions overlie one another thereby to form at least one signal path; and
   the first conductive regions of the first and second interconnection layers being electrically interconnected by conductive vias in said insulating layer at every point at which the first conductive regions overly one another except along said isolated signal conductive regions, the second conductive regions of the first and second interconnection layers being electrically interconnected by the conductive vias in said insulating layer at every point at which the second conductive regions overly one another except along said isolated signal conductive regions.

21. A method of forming a multichip module comprising the steps of:
   providing an insulating layer;
   forming a first interconnect layer on one side of said insulating layer, said first interconnect layer comprising a plurality of parallel interdigitated first and second conductive regions;
   isolating a portion of said interdigitated first and second conductive regions in said first interconnecting layer to form a plurality of parallel isolated signal conductive regions in said first interconnecting layer;
   forming a second interconnect layer over said insulating layer comprising parallel interdigitated first and second conductive regions overlying and oriented orthogonally to the first and second conductive regions of the first interconnect layer;
   isolating a portion of said interdigitated first and said conductive regions in said second interconnecting layer to form a plurality of parallel isolated signal conductive regions in said second interconnecting layer;

forming a pattern of conductive vias in said insulating layer for electrically interconnecting the first and second conductive regions of the first and second interconnect layers to form at least two electrical planes, for electrically interconnecting the first conductive regions of the first and second interconnect layers at every point at which the first conductive regions overlie one another except along said isolated signal conductive regions, for electrically interconnecting the second conductive regions of the first and second interconnect layers at every point at which the second conductive regions overlie one another except along said isolated signal conductive regions, the first conductive regions of the first and second interconnect layers forming a power plane, the second conductive regions of the first and second interconnect layers forming a ground plane, portions of each electrical plane appearing on both interconnect layers, and for electrically interconnecting the isolated signal conductive regions at every point where the signal conductive regions overlie one another to form at least one signal path;

forming connecting pads in at least one interconnection layer for making external connections to the electrical planes; and forming connecting pads in at least one interconnect layer for making external connections to the at least one signal path.

* * * * *